United States Patent [19]

Skarvinko

[11] 4,237,216
[45] Dec. 2, 1980

[54] PHOTOSENSITIVE PATTERNABLE COATING COMPOSITION CONTAINING NOVOLAK TYPE MATERIALS

[75] Inventor: Eugene R. Skarvinko, Binghamton, N.Y.

[73] Assignee: International Business Machines Corporation, Armonk, N.Y.

[21] Appl. No.: 967,742

[22] Filed: Dec. 8, 1978

[51] Int. Cl.³ ............................ G03C 1/68; C08F 8/00
[52] U.S. Cl. ................................ 430/280; 204/159.15; 430/281; 430/288; 430/311; 430/312
[58] Field of Search .......................... 96/115 R, 115 P; 204/159.15; 430/280, 281, 311, 312, 288

[56] References Cited

U.S. PATENT DOCUMENTS

| 3,301,743 | 1/1967 | Fekete et al. | 161/194 |
| 3,450,613 | 6/1969 | Steinberg | 204/159.15 |
| 3,637,618 | 1/1972 | May | 260/837 |
| 3,804,735 | 4/1974 | Radlowe et al. | 204/159.23 |
| 3,847,770 | 11/1974 | Radlowe et al. | 204/159.22 |
| 3,912,670 | 10/1975 | Huemmer et al. | 260/23 EP |
| 3,968,016 | 7/1976 | Wismer | 204/159.16 |
| 4,014,771 | 3/1977 | Rosenkranz et al. | 204/159.23 |
| 4,169,732 | 10/1979 | Shipley | 430/280 |

Primary Examiner—Jack P. Brammer
Attorney, Agent, or Firm—Pollock, Vande Sande & Priddy

[57] ABSTRACT

A photosensitive coating composition comprising a reaction product of a monoethylenically unsaturated carboxylic acid and an epoxy polymer having at least about six epoxy groups; a polyethylenically unsaturated compound; and photoinitiator; and method of employing the same.

19 Claims, No Drawings

PHOTOSENSITIVE PATTERNABLE COATING COMPOSITION CONTAINING NOVOLAK TYPE MATERIALS

DESCRIPTION

1. Technical Field

The present invention is concerned with a photosensitive epoxy polymer coating composition and method for employing the same as a negative resist. The photosensitive compositions of the present invention include a prereaction product of an epoxy polymer having at least about six groups with monoethylenically unsaturated carboxylic acid. Those portions of the compositions of the present invention which are exposed to ultraviolet light are cured.

Providing coating compositions which exhibit acceptable imaging (resolution and acuity) characteristics to be suitable as an image or pattern mask particularly for integrated circuits along with the necessary physical characteristics to provide a permanent protective coating is quite difficult. In particular, compositions suitable as a patterned protective coating for a circuit board must possess a number of different types of properties. In many instances, according to the specific use and/or environment of use, and depending upon priorities, a balancing of properties becomes necessary. In particular, a satisfactory level of one property is achieved by a reduction in the performance of another property. In many coatings, for instance, film forming properties are sacrificed in order to obtain satisfactory resolution and acuity, and likewise, acuity has been sacrificed, when possible, to achieve desirable film-forming characteristics.

In the manufacture of printed circuit boards, it is desirable that the polymeric material used be patternable by means of a photolytic process, as is the practice with photoresist, and which also, unlike photoresist, can be retained to perform one or more additional functional uses during or after fabrication of the circuit board. In view of the combination of good properties obtainable by the products of the present invention, such functions, for example, use as a permanently retained etch mask, solder mask, plating mask, dielectric film or protective coating are possible.

According to the present invention, it has been found that particular reaction products of a monoethylenically unsaturated carboxylic acid with certain epoxides in particular relative amounts in combination with the other constituents of the composition provide photoprocessable coatings which not only exhibit good resolution (e.g., sharply defined acuity), but also possess excellent film-forming properties such as good flexibility and toughness.

A particular problem encountered with certain prior art photo-processable epoxy coatings for use in integrated circuits is the defect referred to as "scalloping" appearing on circuitry lines on an integrated circuit after processing. The term "scalloping" refers to the presence of undulations or waves on the surface of circuitry lines believed to be due to excessive shrinkage of the coating during development (i.e., exposure to a solvent for removal of unexposed polymer). Therefore, an object of the present invention is to significantly reduce, if not substantially eliminate, the problem of "scalloping." In extreme cases, the coating could actually be broken through thereby exposing metal lines. Another object of the present invention is to provide compositions which result in minimal loss of film thickness after developing and baking.

A still further object of the present invention is to provide compositions which do not require the use of certain suspected carcinogenic materials employed in the prior art at certain stages of the process such as trichloroethylene as a developer.

2. Background Art

Certain epoxy compositions have been suggested as photosensitive resists. For example, the use of certain reaction products of a monoethylenically unsaturated acid and certain epoxides for the manufacture of patterned articles such as printed electronic circuits has been suggested in U.S. patent application Ser. No. 613,784, filed Sept. 16, 1975 entitled "Photo-Processable Coatings" to Abolafia et al and assigned to the assignee of the instant application and now abandoned; and U.S. patent application Ser. No. 867,996 to Shipley entitled "Photosensitive Coating Composition and Use Thereof" and assigned to the assignee of the instant application and now U.S. Pat. No. 4,169,732.

U.S. application Ser. No. 613,784 to Abolafia et al discloses a photosensitive coating composition which differs from the present invention in that the amount of acrylic acid employed is much less than that required by the present invention. There is no suggestion in said application that a significant increase in the amount of acrylic acid would avoid the problem of scalloping or would achieve the other advantages achieved by the present invention. Also, the primary aromatic amine employed in the examples of U.S. patent application Ser. No. 613,784 is not necessary in the compositions of the present invention. In fact, in the present invention, it is preferably to provide compositions which are free from such primary amines since such are suspected carcinogenes. Also, according to the present invention, it is possible and preferred to employ a developer different from the trichloroethylene which is now used with the compositions specifically presented in the examples of said U.S. patent application Ser. No. 613,784. This is advantageous since trichloroethylene is a suspected carcinogenic material.

In addition, the compositions of the present invention do not require the use of carbon tetrabromide initiator which is employed in the current commercial version of the compositions disclosed in said application. Another advantage of the present invention as will be more fully discussed hereinbelow as compared to the current commercial version of the compositions disclosed in U.S. patent application Ser. No. 613,784 is that the loss of film thickness after developing and baking is substantially reduced.

U.S. Pat. No. 4,169,732 fails to suggest the present invention since the invention therein is concerned with a mixture of certain epoxides which are quite distinct from the type of polyfunctional polymers required by the present invention. In fact, if anything, U.S. Pat. No. 4,169,732 would tend to lead persons skilled in the art away from the present invention. For instance, on column 5, lines 17-52 of said patent, it is disclosed that an epoxy of the type used in the present invention was used in place of epoxides required by the invention of U.S. Pat. No. 4,169,732 but did not provide entirely satisfactory results. The actual tests carried out by the inventor of U.S. Pat. No. 4,162,732 consistent with the disclosure of application Ser. No. 613,784 to Abolafia et al employed significantly less acid than required by the present invention.

Other suggestions of the use of certain reaction products of monoethylenically unsaturated acids and certain epoxides for the manufacture of patterned articles included U.S. Pat. No. 3,661,576 to Crary and U.S. Pat. No. 3,989,610 to Tsukada et al.

Also, various coating compositions containing monoethylenically unsaturated acid-epoxy adducts have been suggested for coating operations, which do not involve the problems of resolution experienced in the use of a composition as a photosensitive resist in the manufacture of patterned articles such as printed circuits. Exemplary of such disclosures are U.S. Pat. No. 3,912,670 to Huemmer et al, U.S. Pat. No. 3,772,062 to Shur et al, U.S. Pat. No. 3,450,613 to Steinberg et al, U.S. Pat. No. 4,003,877 to Lipson et al, and U.S. Pat. No. 4,014,771 to Rosenkranz et al.

Furthermore, photosensitive composition based on epoxide resins which have not been prereacted with a monoethylenically unsaturated acid but which must include certain specific types of sensitizers have been suggested for use in preparing selective or patterned coatings. An example of such prior art is U.S. Pat. No. 3,930,856 to DeMoira.

Also, compositions which are not photosensitive but which contain monoethylenically unsaturated acid-epoxy adducts have been suggested. Examplary of such disclosures are U.S. Pat. Nos. 3,301,743 and 3,373,075 to Fekete. Some additional prior art which is concerned with reactions of ethylenically unsaturated acids and different epoxide resins include British Pat. Nos. 717,708 and 794,572; and U.S. Pat. Nos. 3,637,618, 3,804,735, 3,840,448, 3,847,770, and 3,968,016.

DISCLOSURE OF INVENTION

The present invention is concerned with a photoprocessable patternable coating composition. The composition includes the reaction product of at least one epoxidized nonlinear novolac having at least six terminal epoxy groups with at least one monoethylenically unsaturated carboxylic acid. The carboxylic acid(s) are employed in amounts of at least about 0.9 moles per epoxide equivalent weight of the epoxidized novolac. The composition also contains at least one polyethylenically unsaturated compound and at least one photoinitiator.

The present invention is also concerned with substrates coated with the above composition.

Another aspect of the present invention is directed to a method for producing a negative resist image. The method includes exposing a film of the above composition to ultraviolet light in a predetermined pattern. The exposure is continued until substantial curing of the film is achieved in the exposed areas. Those portions of the film which are not exposed to the ultraviolet light are removed.

BEST MODE FOR CARRYING OUT INVENTION

According to the present invention, particular reaction products of at least one α,β-ethylenically unsaturated carboxylic acid with at least one epoxidized nonlinear novolac having at least about six terminal epoxy groups are employed. With respect to the α,β-ethylenically unsaturated carboxylic acids, such are well known and readily available commercially. Exemplary of such acids are acrylic acid, methacrylic acid, and crotonic acid. The most preferred ethylenically unsaturated carboxylic acid employed according to the present invention is acrylic acid.

The epoxidized novolac employed in the present invention must be nonlinear (e.g., highly branched chain) and must contain at least about six terminal epoxy groups and preferably about eight terminal epoxy groups. Epoxidized novolac polymers are commercially available and can be prepared by known methods by the reaction of a thermoplastic phenolic-aldehyde of a polynuclear dihydric phenol with a halo-epoxy alkane.

The polynuclear dihydric phenol can have the formula:

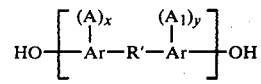

wherein Ar is an aromatic divalent hydrocarbon such as naphthylene and, preferably, phenylene, A and $A_1$ which can be the same or different are alkyl radicals, preferably having from 1 to 4 carbon atoms, halogen atoms, ie.., fluorine, chlorine, bromine and iodine, or alkoxy radicals, preferably having from 1 to 4 carbon atoms, x and y are integers having a value 0 to a maximum value corresponding to the number of hydrogen atoms on the aromatic radical (Ar) which can be replaced by substituents and $R^1$ is a bond between adjacent carbon atoms as in dihydroxydiphenyl or is a divalent radical including, for example,

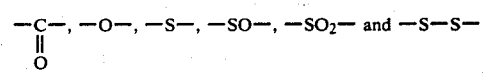

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others: The bis-(hydroxyphenyl)alkanes such as 2,2-bis-(4-hydroxyphenol)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1-bis-(4-hydroxyphenyl)ethane, 1,2-bis-(4-hydroxyphenyl)ethane, 1,1-bis-(4-hydroxy-2-chlorphenyl)ethane, 1,1-bis(3-methyl-4-hydroxyphenyl)ethane, 1,3-bis-(3-methyl-4-hydroxyphenyl)propane, 2,2-bis-(3-phenyl-4-hydroxyphenyl)propane, 2,2-bis-(3-isopropyl-4-hydroxyphenyl)propane, 2,2-bis(2-isopropyl-4-hydroxyphenyl)propane, 2,2-bis(4-hydroxynaphthyl)propane, 2,2-bis-(4-hydroxyphenyl)pentane, 3,3-bis-(4-hydroxyphenyl)pentane, 2,2-bis-(4-hydroxyphenyl)heptane, bis-(4-hydroxyphenyl)phenylmethane, bis-(4-hydroxyphenyl)cyclohexylmethane, 1,2-bis-(4-hydroxyphenyl)-1,2-bis-(phenyl)propane and 2,2-bis-(4-hydroxyphenyl)-1-phenyl-propane; di(hydroxyphenyl)sulfones such as bis-(4-hydroxyphenyl)sulfone, 2,4'-dihydroxydiphenyl sulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,3'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl) ether, bis-(4-hydroxy-3-chlorophenyl)ether, bis-(4-hydroxy-3-fluorophenyl)ether, bis-(4-hydroxy-3-bromophenyl)ether, bis-(4-hydroxynaphthyl)ether, bis-(4-hydroxy-3-chloronaphthyl)ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

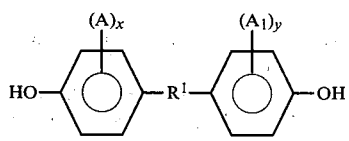

wherein A and $A_1$ are as previously defined, x and y have values from 0 to 4 inclusive and $R^1$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2-bis(p-hydroxyphenyl)propane.

As condensing agents, any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formalin. The preferred aldehyde is formaldehyde.

The halo-epoxy alkane can be represented by the formula:

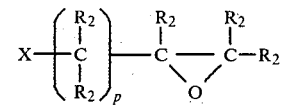

wherein X is a halogen atom (e.g., chlorine, bromine, and the like), p is an integer from 1-8, each $R_2$ individually is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

The preferred epoxidized novolac employed in the present invention is represented by the average formula:

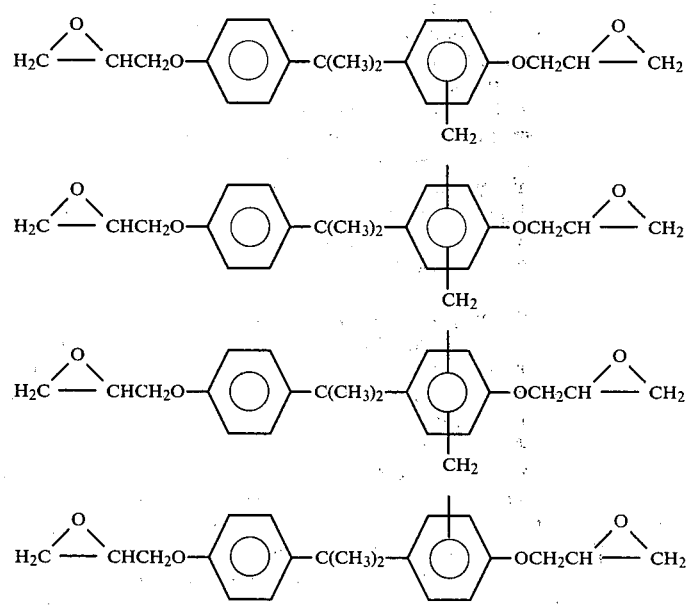

Such is commercially available under the trade designation EPI-REZ SU8.

It is essential to the practice and success of the present invention that the monoethylenically unsaturated carboxylic acid(s) be employed in amounts of at least about 0.9 moles per epoxide equivalent weight of the epoxidized novolac. The epoxide equivalent weight is defined as the weight of the polymer in grams which contain one gram equivalent of epoxy. Use of amounts of carboxylic acid less than that employed in the present invention, such as use of only about 0.5 moles per epoxide equivalent weight resulted in curing or setting up of the polymer before it could be used as a coating. The monocarboxylic acid is generally used in amounts of about 0.9 to about 2 moles and preferably at least about 1 mole per epoxide equivalent weight of the epoxidized novolac. The most preferred amounts of monocarboxylic acid are about 1 to about 1.2 moles per epoxide equivalent weight of the epoxidized novolac.

The conditions for reacting the epoxy and carboxylic acid are well known and need not be described herein in any great detail. For instance, temperatures of about normal room temperature to about 85° C. are suitable. Times of reaction of from about 1 hour and up have been found quite adequate. Atmospheric pressures are generally used. However, higher or lower pressures can be employed, when desired.

The polyethylenically unsaturated compounds employed in the compositions of the present invention must be capable of reacting upon exposure to ultraviolet light and should contain terminal ethylenic groups and is employed in amounts sufficient for rendering the compositions light sensitive to the desired degree. Such compounds include unsaturated esters of polyols and especially esters of the methylene carboxylic acid such as ethylene diacrylate; diethylene glycol diacrylate; glycerol diacrylate; glycerol triacrylate; ethylene dimethacrylate; 1,3-proylene dimethacrylate; 1,2,4-butane triol trimethacrylate; 1,4-benzenediol dimethacrylate; pentaerythritol tetramethacrylate; 1,3-propane diol diacrylate; 1,6-hexane diol diacrylate; the bis-acrylates and methacrylates of polyethylene glycols of molecular weight 200–500; trimethylol propane triacrylate; pentaerythritol triacrylate; unsaturated amides such as those of the methylene carboxylic acids and especially those of alpha, omega-diamines and oxygen-interrupted omega-diamines such as methylene bisacryl and bismethacrylamide; diethylene triamine tris-methacrylamide; bis-(methacrylamidopropoxy) ethane; bis-methacrylamido-ethyl methacrylate N-[($\beta$-hydroxyethyloxy)ethyl] acrylamide; vinyl-esters such as divinyl succinate; divinyl adipate; divinyl phthalate, divinyl terephthalate, divinyl benzene-1,3-disulfonate, and divinyl butane-1,4-disulfonate; and unsaturated aldehydes such as sorbaldehyde.

The preferred polyethylenically unsaturated compounds include the polyethylene glycoldiarylates and trimethylol propane triacrylate. The relative amount of the polyethylenically unsaturated compound employed according to the present invention is generally about 0.5% to about 40% and preferably about 1% to about 20% and most preferably at least about 3% by weight.

The prior compositions employing carboxylic acid reaction products of the types of epoxides employed herein (i.e., those disclosed in U.S. patent application Ser. No. 613,784) required amounts of polyethylenically unsaturated compounds of about 1% or less in order to keep the "scalloping" problem at a minimum. However, the use of these small amounts of the polyethylenically unsaturated compounds results in limiting the light sensitivity of the compositions. The present invention makes it possible to employ larger amounts of the polyethylenically unsaturated compounds without experiencing the "scalloping" problem.

The compositions of the present invention further include a photoinitiator or sensitizer. Many such materials are well known to the prior art. Examples of some suitable photoinitiators include anthraquinone and substituted anthraquinones such as the alkyl substituted or halo substituted anthraquinones including 2-tert-butylanthraquinone, 1-chloroanthraquinone; p-chloroanthraquinone, 2-methylanthraquinone, 2-ethylanthraquinone and octamethylanthraquinone; other substituted or unsubstituted polynuclear quinones including 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquione, 2,3-dimethylanthraquinone, 2-henylanthraquinone, 2,3-diphenylanthraquinone, 3-chloro-2-methylanthraquinone, retenequinone, 7,8,9,10-tetrahydronaphthacenequinone, 1,2,3,4-tetrahydrobenzanthracene-7,12-dione.

Other photo-sensitizers include halogen-type sensitizers such as carbontetrachloride, bromoform and carbontribromide; benzotriazole; benzoin, chloranil, benzil, diacetyl, 5-nitrosalicylaldehyde, 2,4-dinitrotoluene, Mixtures of photoiniators can be employed when desired. The preferred photoinitiators include benzotriazole and the anthraquinones such as tert.-butyl anthraquinone. The photoinitiator is employed in amounts sufficient to sensitize the composition to ultraviolet light and is generally about 0.1 to about 10% and preferably from 0.1 to about 5% by weight. In a preferred embodiment about 1 to 5% t.-butyl-anthraquinone is employed along with about 0.05 to about 0.5% of benzotriazole.

Also in the most preferred aspects of the present invention, the compositions are substantially free from the inorganic bromine-type sensitizers such as bromoform and carbontribromide primarily because of the relative expense involved. In fact, the absence of carbontetrabromide can result in a 50% reduction in the cost of the composition.

In addition, the compositions when desired can include an organic nonreactive diluent to facilitate the coating operation. Examples of suitable solvents include trichloroethylene, cellosolve acetate, methyl carbitol, butyl carbitol, methylene chloride, and ketones such as acetone and methyl ethyl ketone. When employed, the diluent is present in an amount sufficient to provide compositions having a viscosity of about 30 to about 2500 centistokes depending upon the mode of application of the composition. For instance, spraying applications are usually carried out employing viscosities of about 30 to about 200 centistokes, and spinning applications are generally carried out using viscosities of about 80 to 100 centistokes.

The compositions can also contain auxiliary agents such as additional hardeners for post cure (e.g., phenylamidazole) when desired.

The compositions of the present invention can be prepared by first obtaining a solution of the epoxy polymer and then adding the monocarboxylic acid along with a promoter or mixture of promoters such as primary, secondary or tertiary amine including benzyldimethylamine, triethylamine, and triethanolamine; or a metal salt such as stannous octoate and ferrous octoate to promote reaction of the carboxylic acid group of the acid with the terminal epoxy groups of the epoxide polymer. The preferred promoters employed are the tertiary amines such as benzyldimethylamine. In the most preferred aspects of the present invention, the composition is free from primary aromatic amines such as methylene dianiline which is a suspected carcinogenic compound. Such primary amines; however, are required by the compositions disclosed in the above-discussed U.S. patent application Ser. No. 613,784 for achieving acceptable light sensitivity.

After admixture and reaction of the acid and epoxy, the other ingredients, the polyethylenically unsaturated compound, and the photoinitiators are generally added to the composition. In addition, if additional diluents are desired to reduce the viscosity of the composition, such can conveniently be added at this stage.

Next, the composition is coated onto the desired substrate to the desired thickness. Usually not more than about 10 mils and preferably not more than about 5 mils is adequate for preparing printed circuits with about 2 mils being a convenient minimum amount. The photoresist can be coated onto a carrier film or onto the desired circuit board depending upon the intended process to be used.

The carrier films must be capable of being stripped or releasable from the composition without damaging the integrity of the film formed and should be flexible enough so that it can be wound up for convenience. Suitable carrier films include polyesters such as polyethylene-terephthalate (e.g., Mylar). The film is then exposed to ultraviolet light radiation through an image-bearing transparency of the desired pattern. The exposure to the ultraviolet light causes the polymer composition to cross-link thereby rendering it insoluble.

After exposure to the ultraviolet light and after removal of any supporting films (if employed), the coating is developed by removing areas not struck by ultraviolet light. This can be accomplished by immersing or spraying the film with a suitable solvent. The solvent selected is one which will dissolve the uncured polymer composition without attacking to any undesired extent the cured composition. Butyl carbitol acetate and butyl carbitol are suitable solvents for carrying out the present invention. As discussed hereinabove, an advantage of the present invention is the ability to use a solvent for the developing other than trichloroethylene which is a suspected carcinogenic compound.

Moreover, when desired, the film can be post-cured by subjecting the film to elevated temperatures such as about 100° to about 160° C. for about ½ to about 10 hours. The post-curing times employed can be less than those found desirable for the compositions of application Ser. No. 613,784 while obtaining harder films than those in said application.

The use of additives which are normally used in epoxy technology can generally be employed with photo-processable coatings of this invention. Obviously, additives which drastically interfere with either the light absorption of the coating or with the photoresist must be avoided. When additives are used it would be preferable to add them after the prereaction product of the acid and epoxy has been prepared in order to avoid any possible deleterious interactions with the reaction mechanisms.

Substrates over which the photo-processable coating is spread may be any metal, plastic, glass or any other material over which epoxy materials are normally spread. The range of light exposure, time and intensity for a typical photo-processable coating may be ascertained from the following typical conditions: 30 inches from carbon arc, lamp manufactured by Nu-Ark Company, Inc., Chicago, Ill., 15.5 amps for a period of about 1 minute to about 10 minutes. Since the films obtained according to the present invention can be visably clear, the film thickness has very little, if any, effect upon the exposure time needed.

The following examples serve to illustrate preferred embodiments of this invention and are not intended to limit the teachings as set forth herein.

EXAMPLE 1

To a 50% solution containing 197 parts by weight of an octafunctional epoxy resin (SU-8) having an epoxy equivalent of about 197 and about 197 parts by weight of trichloroethylene was added about 72.06 parts by weight of acrylic acid and about 1.7 parts by weight of benzyl dimethylamine as a promoter. The mixture is allowed to react at about 65° C. for about 64 hours. About 100 parts of the above composition are admixed with about 2 parts by weight of trimethylol propane triacrylate, about 2 parts by weight of tert-butyl anthraquinone, about 0.1 parts by weight of benzotriazole, about 24 parts by weight of trichloroethylene and about 4 parts by weight of methylethyl ketone.

The composition is coated onto one side of a 5 ounce copper substrate by spin coating to a thickness of about 2½–3 mils and dried at 60° C. for 2 hours.

The coating is exposed through a step wedge 20 inches from the 15.5 amp carbon arc lamp described hereinabove. Exposure time of about 3 minutes is more than adequate for producing an acceptable image upon development. The composition is developed by contacting with butyl carbitol acetate.

Excellent photo images with sharp edges and excellent resolution were obtained from the above coating. These results have been repeatable when using different lots of the above epoxy polymer.

Over 90% of the original thickness was retained according to the present invention as compared to about 45% in prior art commercial version of the compositions disclosed in U.S. patent application Ser. No. 613,784. Accordingly, the problem of excessive thickness loss is obviated by the present invention.

EXAMPLE 2

To a 50% solution containing about 220 parts by weight of an octafunctional epoxy resin (Epi-Rez SU-8) having an epoxy equivalent weight of about 220 and about 220 parts by weight of trichloroethylene was added about 72.06 parts by weight of acrylic acid and about 2.2 parts by weight of benzyl dimethylamine as a promoter. The mixture is allowed to react at about 65° C. until the viscosity reaches 1800±200 centistokes which took about 48 hours.

About 100 parts of the above composition is admixed with about 50 parts by weight of ethyleneglycol monomethylether, about 2 parts by weight of tertbutyl anthraquinone, about 2 parts by weight of trimethylol propane triacrylate, about 1 part of 2-phenylimidazole, and about 0.05 parts of benzotriazole.

The composition is coated onto one side of a copper clad printed circuit board by spraying to an average thickness of about 2½ mils and dried at about 60° C. for about 2 hours.

The coating is exposed through a step wedge 20 inches from the 15.5 amp carbon arc lamp described hereinabove. Exposure time of about 3 minutes is more than adequate for producing an acceptable image upon development. The composition is developed by contacting with butyl carbitol.

Excellent photo images with sharp edges and excellent resolution were obtained from the above coating.

No "scalloping" of the composition was observed. Over 90% of the original thickness was retained after development.

Having thus described my invention, what I claim as new, and desire to secure by Letters Patent is:

1. A photoprocessable patternable coating composition consisting essentially of:
   (A) the reaction product from a mixture consisting essentially of:
      (1) at least one epoxidized nonlinear novolak having at least about six terminal epoxy groups; with,
      (2) at least about 0.9 moles of at least one monoethylenically unsaturated carboxylic acid per epoxide equivalent weight of said novolak;
   (B) at least one polyethylenically unsaturated compound; and
   (C) at least one photoinitiator.

2. The coating composition of claim 1 wherein said novolak has at least about 8 terminal epoxy groups.

3. The coating composition of claim 1 wherein said novolak has the average formula:

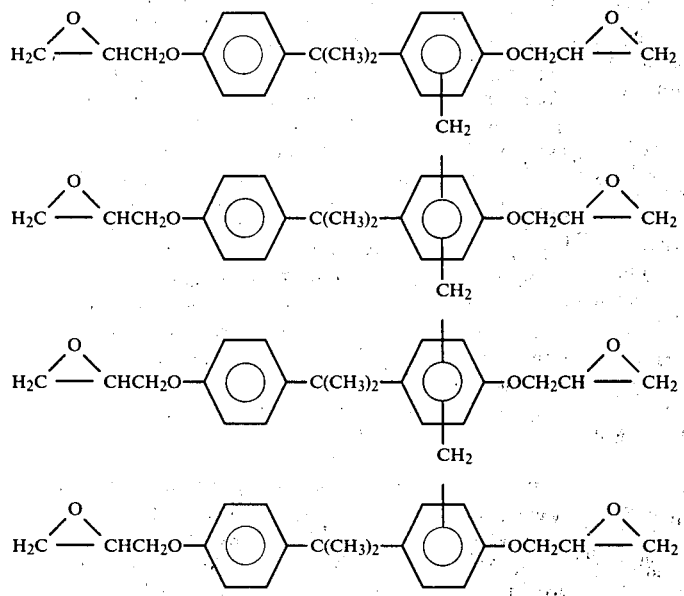

4. The coating composition of claim 1 wherein said carboxylic acid is selected from the group of acrylic acid, methacrylic acid, crotonic acid, and mixtures thereof.

5. The coating composition of claim 1 wherein said acid is acrylic acid.

6. The coating composition of claim 1 wherein the amount of monocarboxylic acid employed is about 0.9 to about 2 moles per epoxide equivalent weight of the epoxidized novolak.

7. The coating composition of claim 1 wherein the monocarboxylic acid is employed in amounts of about 1 to about 1.2 moles per epoxide equivalent weight of said novolak.

8. The coating composition of claim 1 wherein the polyethylenically unsaturated compound is present in amounts of about 0.5 to about 40% by weight.

9. The coating composition of claim 1 wherein the polyethylenically unsaturated compound is present in amounts of about 1 to about 20% by weight.

10. The coating composition of claim 1 wherein the polyethylenically unsaturated compound is present in amounts of at least about 3% by weight.

11. The coating composition of claim 1 wherein said polyethylenically unsaturated compound is trimethylol propane triacrylate.

12. The coating composition of claim 1 wherein said polyethylenically unsaturated compound is a polyethylene glycol diacrylate.

13. The composition of claim 1 wherein said photoinitiator is present in an amount of about 0.1 to about 10% by weight.

14. The coating composition of claim 1 wherein said photoinitiator is present in an amount of about 0.1 to about 5% by weight.

15. The coating composition of claim 1 wherein said photoinitiator includes tert-butyl anthraquinone and benzotriazole.

16. The coating composition of claim 1 which further includes phenyl imidazole.

17. The coating composition of claim 1 which further includes a diluent to provide a composition having a viscosity of about 30 to about 2500 centistokes.

18. The coating composition of claim 3 which further includes phenyl imidazole; wherein said acid is acrylic acid, said polyethylenically unsaturated compound is trimethylol propane triacrylate, or a polyethylene glycol diacrylate or mixture thereof; said photoinitiator includes tert-butyl anthraquinone and benzotriazole; and which further includes a diluent to provide a composition having a viscosity of about 30 to about 2500 centistokes.

19. The coating composition of claim 1 wherein said photoinitiator is selected from the group of polynuclear quinones, substituted polynuclear quinones, halogen-type sensitiziers, benzotriazole, benzoin, chloranil, benzil, diacetyl, 5-nitrosalicylaldehyde, 2,4-dinitrotoluene, or mixtures thereof.

* * * * *

UNITED STATES PATENT AND TRADEMARK OFFICE
CERTIFICATE OF CORRECTION

PATENT NO. : 4,237,216  
DATED : December 2, 1980  
INVENTOR(S) : Skarvinko, Eugene R.

Page 1 of 3

It is certified that error appears in the above—identified patent and that said Letters Patent is hereby corrected as shown below:

Column 1, line 13, insert --epoxy-- after "six".
Column 2, line 35, change "preferably" to --preferable--;
        line 37, change "carcinogenes" to --carcinogens"; and
        line 67, change "4,162,732" to --4,169,732".
Column 3, lines 5 and 6, change "included" to --include--.
Column 4, line 24, change "ie." to --i.e.--;
        line 52, insert a hyphen (-) after "bis" (second occurrence);
        line 56, insert a hyphen (-) after "bis" (first occurrence);
        line 59, insert a hyphen (-) after "bis"; and
        line 60, insert a hyphen (-) after "bis".
Column 5, line 27, insert a hyphen (-) after "2,2-bis".

UNITED STATES PATENT AND TRADEMARK OFFICE
CERTIFICATE OF CORRECTION

PATENT NO. : 4,237,216
DATED : December 2, 1980
INVENTOR(S) : Skarvinko, Eugene R.

It is certified that error appears in the above—identified patent and that said Letters Patent is hereby corrected as shown below:

Column 6, line 21, delete the hyphen (-) after "epoxy" so that it reads --1-chloro-2-methyl-2,3-epoxypropane--; and line 22, delete the hyphen (-) after "epoxy" so that it reads --1-bromo-2,3-epoxypentane--.

Column 7, line 15, delete "from"; and line 48, change "glycoldiarylates" to --glycoldiacrylates--.

Column 8, line 12, change "2-henylanthraquinone" to --2-phenylanthraquinone--;

line 40, change "cellosolve" to --Cellosolve--; and line 68, change the semicolon (;) after "amines" to a comma (,).

UNITED STATES PATENT AND TRADEMARK OFFICE
CERTIFICATE OF CORRECTION

PATENT NO. : 4,237,216  Page 3 of 3
DATED : December 2, 1980
INVENTOR(S) : Skarvinko, Eugene R.

It is certified that error appears in the above—identified patent and that said Letters Patent is hereby corrected as shown below:

Column 10, line 8, insert --about-- after "containing";
line 11, change "was" to --were--;
line 45, change "was" to --were--; and
line 51, change "is" to --are--.

Signed and Sealed this

Third Day of November 1981

[SEAL]

Attest:

GERALD J. MOSSINGHOFF

*Attesting Officer*  *Commissioner of Patents and Trademarks*